United States Patent [19]

Komatsuzaki

[11] 4,417,945

[45] Nov. 29, 1983

[54] APPARATUS FOR CHEMICAL ETCHING OF A WAFER MATERIAL

[75] Inventor: Yasuo Komatsuzaki, Annaka, Japan

[73] Assignee: Shin-Etsu Handotai Co., Ltd., Tokyo, Japan

[21] Appl. No.: 460,355

[22] Filed: Jan. 24, 1983

[30] Foreign Application Priority Data

Mar. 29, 1982 [JP] Japan .................................. 57-50483

[51] Int. Cl.³ ......................................... H01L 21/306
[52] U.S. Cl. .................................... 156/639; 156/345; 156/654; 156/662
[58] Field of Search ............... 156/637, 636, 638, 639, 156/645, 654, 662, 345

[56] References Cited

U.S. PATENT DOCUMENTS 2,328,533  8/1943  Walker ........................... 156/345 X
3,549,439 12/1970  Kaveggia et al. ..................... 156/636

Primary Examiner—William A. Powell
Attorney, Agent, or Firm—Hopgood, Calimafde, Kalil, Blaustein & Judlowe

[57] ABSTRACT

An apparatus is provided for chemically etching, for example, a semiconductor wafer material in an etching solution to remove the surface strain caused by mechanical working such as lapping and polishing. The apparatus comprises a disk rotatable around an axis in the solution and provided on the surface with groove-like liquid flow channels and a means for holding the wafer closely side-by-side to face the rotatable disk and the rotatable disk and the wafer are each rotated around its own axis with simultaneous reciprocative movement of the wafer along a radial direction of the disk so that very high degree of uniformity is ensured in the etching effect on the wafer surface.

8 Claims, 8 Drawing Figures

APPARATUS FOR CHEMICAL ETCHING OF A WAFER MATERIAL

BACKGROUND OF THE INVENTION

The present invention relates to an apparatus for chemically etching a wafer-like material in an etching solution or, more particularly, to an apparatus in which a wafer-like material such as a semiconductor silicon wafer can be readily finished by a chemical etching means in an etching solution to be imparted with highly planiform or flat surfaces with good parallelism.

As is well known, semiconductor silicon wafers, from which various kinds of electronic devices are fabricated, are prepared by grinding and soiling a single crystal rod of high purity silicon into thin wafer-like forms followed by lapping and mirror-polishing of the surfaces. It is therefore unavoidable that the surface layer of the thus polished silicon wafer is more or less under mechanical strain caused in the above mentioned steps of mechanical working. Accordingly, it is a usual practice that the strained surface layer of the silicon wafer is removed by chemically etching the surface in an etching solution before the silicon wafer is further processed into electronic devices.

It is of course essential in this chemical etching that the reaction with the etching solution proceeds uniformly over whole surface of the wafer by preventing localized oxidation reaction and the etching is terminated at one time so that the uniformity in the removed amount of the surface layer is ensured from portion to portion on the wafer surface resulting in highly planiform surfaces with excellent parallelism of the finished wafer material.

Such a uniform proceeding of the etching reaction is obtained when the oxidation product formed in the etching solution on the wafer surface by the reaction with the etching solution is rapidly diffused out of the surface region together with dissipation of the heat of reaction to be replaced with a fresh portion of the etching solution and the etching solution is brought into contact with the wafer surface in a turbulent flow so that the means contacting distance of a volume fraction of the etching solution with the wafer surface is minimized.

In order to ensure the above mentioned desirable conditions of contacting between the wafer surface and the etching solution, various types of apparatuses have been proposed in the prior art to be used for the chemical etching of wafer materials. In an example, a plural number of the wafer materials are held horizontally or vertically in a casing in parallel with each other with narrow and uniform spaces therebetween and the flow of the etching solution in the spaces between the parallel wafers is accelerated by rotating each of the wafers around its own axis or around an outer axis or by utilizing the turbulent effect of the rising bubbles.

The above mentioned prior art apparatuses are, however, not always quite satisfactory in respect of the uniformity of the etching reaction due to the localized reaction of the etching solution staying between the oppositely facing wafers leading to the accumulation of the reaction product as well as to the localized temperature elevation of the etching solution. The difficulty due to the above mentioned problem of the non-uniform oxidation reaction is increased more and more with the increase in the diameter of the semiconductor wafers as a trend of the semiconductor technology in recent years. In this regard, no satisfactory apparatus for chemical etching of a wafer material in an etching solution is available hitherto.

SUMMARY OF THE INVENTION

It is therefore an object of the present invention to provide a novel and improved apparatus for chemically etching a wafer material in an etching solution in which the wafer material can be readily and efficiently finished to have highly planiform or flat surfaces with excellent parallelism without suffering the above described problems due to the non-uniformity of the reaction in the prior art apparatuses.

The apparatus of the invention for chemically etching a wafer material in an etching solution contained in an etching vat as proposed here comprises (a) a disk rotatable in the etching solution around an axis, said disk being provided with at least one liquid flow channel on at least one of the surfaces, (b) a means for rotating the rotatable disk around the axis thereof, (c) a means for holding the wafer material to face the surface of the rotatable disk provided with the liquid flow channel side-by-side in such a manner that the surface of the wafer material facing the rotatable disk is substantially in parallel with the surface of the rotatable disk and exposed free to the etching solution keeping a narrow gap space formed between the free surface of the wafer material and the surface of the rotatable disk, (d) a means for rotating the wafer material around the axis thereof, and (e) a means for reciprocatively moving the wafer material held by the holding means within a plane parallel with the surface of the rotatable disk in a radial direction of the rotatable disk.

DETAILED DESCRIPTION OF THE PREFERRED EMBODIMENTS

As is understood from the above description of the inventive apparatus, the principle leading to the unexpected improvements obtained with the inventive apparatus is in the rotation of the wafer material held side-by-side closely facing the rotating disk provided with liquid flow channels on the surface facing the wafer material and the simultaneous reciprocative movement of the wafer material relative to the rotating disk in the radial direction thereof.

In the following, the structure and principle of the inventive apparatus are described in detail with reference to the accompanying drawing which should not be construed to limit the scope of the invention in any way.

Figure 1:
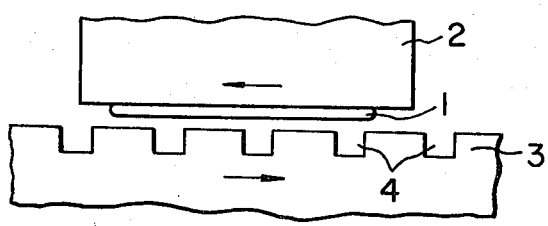
FIG. 1 is a schematic cross sectional view of a wafer material and a rotatable disk provided with liquid flow channels.

FIG. 1 is a schematic illustration for the effectiveness in the desirable uniformity of the oxidation reaction on the surface of the wafer material held side-by-side closely to the surface of a rotatable disk provided with liquid flow channels thereon. The wafer material 1 is held by means of a sucking unit 2 on one surface so that the other surface of the wafer material 1 is free at all. The free surface of the wafer material 1 is closely facing but not in direct contact with a surface of the rotatable disk 3 on which several groove-like liquid flow channels 4 are provided with regular intervals. The wafer material 1 and the rotatable disk 3 are both rotated in an etching solution to be in movement relative to each other. By virtue of the liquid flow channel 4 provided on the surface of the rotatable disk 3, the etching solution between the wafer material 1 and the rotatable disk 3 is agitated and brought into contact with the surface of the wafer material 1 in a turbulent flow so that exchange may take place between the depleted or worn-out etching solution at an elevated temperature in direct contact with the surface of the wafer material 1 and the fresh portion of the etching solution in the liquid flow channels 4. As a result, localized temperature elevation of the etching solution and velocity localization of the oxidation reaction on the wafer surface can be effectively prevented. That is, fresh portions of the etching solution are continuously brought into contact with the wafer surface from the liquid flow channels 4 in the rotating disk 3 over whole surface of the wafer material 1 along with the rotation and the relative movement of them so that the uniformity is ensured of the proceeding of the oxidation reaction and the high flatness and good parallelism of the surfaces of the wafer material 1 can be obtained.

Figure 2:
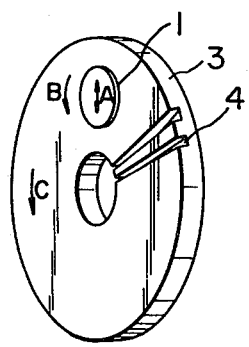
FIG. 2 is a schematic perspective view illustrating the relative movement of the wafer material and the rotatable disk.

FIG. 2 is a perspective view illustrating the respective and relative movements of the wafer material 1 and the rotatable disk 3 provided with the liquid flow channels 4 on one surface thereof. It should be understood that, although the rotatable disk 3 depicted in FIG. 2 has only two radial liquid flow channels 4 thereon, it is for simplicity and the rotatable disk 3 is provided with a plurality of similar liquid flow channels running in the radial directions all over the surface with about regular intervals. As is understood from the figure, the wafer material 1 is held in a substantially vertical disposition by means of a sucking unit (not shown in this figure) and reciprocatively moved up and down along the double-sided arrow A, i.e. in a radial direction of the rotatable disk, keeping the narrow gap space between the wafer material 1 and the rotatable disk 3 and simultaneously rotated around its own axis as shown by the arrow B. On the other hand, the rotatable disk 3 provided with the liquid flow channels 4 is rotated around its own axis as shown by the arrow C so that the velocity difference in the relative movements of the wafer material 1 and the rotating disk 3 is widely varied from portion to portion and the average contacting path of a volume fraction of the etching solution between them is very small per unit surface area of the wafer material 1 to ensure the uniformity in the proceeding of the etching reaction over whole surface of the wafer material 1.

Figure 3A:
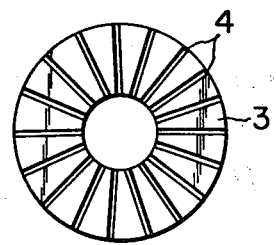
FIGS. 3a to 3d each show an example of the pattern of the liquid flow channels provided on the surface of the rotatable disk.
Figure 3B:
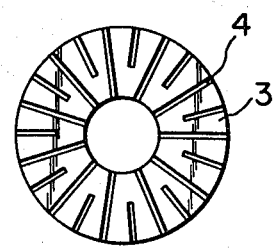
Figure 3C:
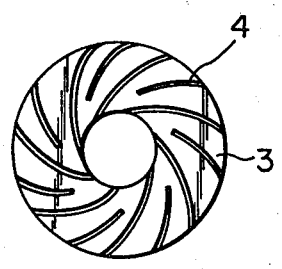
Figure 3D:
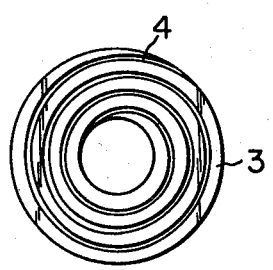

The arrangement or pattern of the liquid flow channels 4 on the surface of the rotatable disk 3 is not particularly limitative and several examples of the patterns of the channel arrangements are shown in FIGS. 3a to 3d though not limited thereto in any way. In the arrangement shown in FIG. 3a, each of the liquid flow channels 4 runs in the radial direction of the disk 3 extending from the center opening to the outer periphery of the disk 3 while, in FIG. 3b, a shorter channel not reaching the center opening from the outer periphery is provided between each pair of two adjacent radial channels of full length as in FIG. 3a. The liquid flow channels shown in FIGS. 3c and 3d are in a vortex-like or spiral form swirling around the center of the disk 3. At any rate, it is desirable condition that the liquid flow channels 4 are arranged with regular intervals or with a uniform pitch. The depth of the groove-like liquid flow channels 4 is not particularly limitative.

Furthermore, similar effects can be obtained by providing a plurality of openings or concavities of a suitable size and depth formed in or on the rotatable disk 3 in place of or in addition to the above mentioned groove-like liquid flow channels 4. The number, size and shape of the liquid flow channels 4 and/or the openings or concavities in the rotatable disk 3 should be determined in consideration of the scale of the apparatus, the size of the wafer material, the nature of the etching solution and other parameters. It is preferable that a rotatable disk 3 is provided on both surfaces with the liquid flow channels 4 so that a single rotatable disk can simultaneously serve for performing the chemical etching of two wafer materials on the different sides of the disk in the etching solution. It is of course optional that an apparatus of the invention is provided with two or more of the rotatable disks in a vat containing the etching solution so that as a large number as desired of the wafer materials can be simultaneously subjected to the chemical etching.

Figure 4:
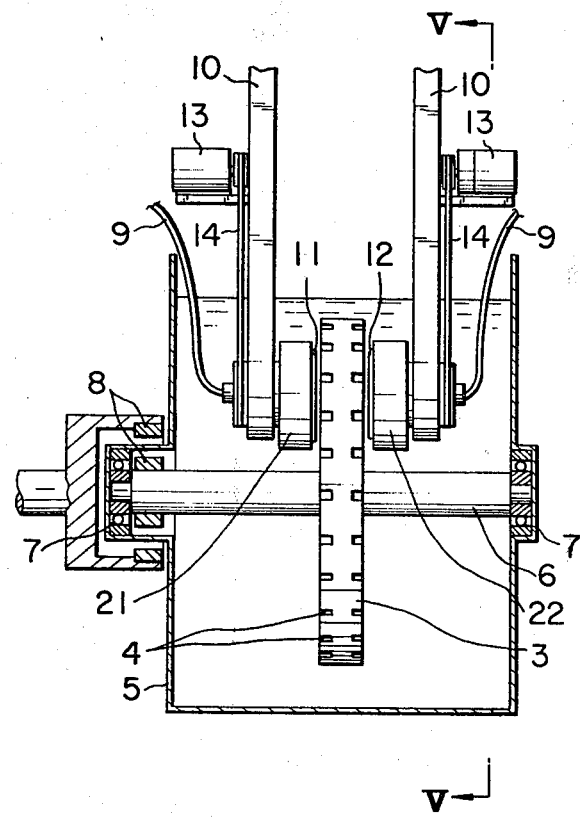
FIG. 4 is a vertical cross sectional view of an apparatus according to the invention.
Figure 5:
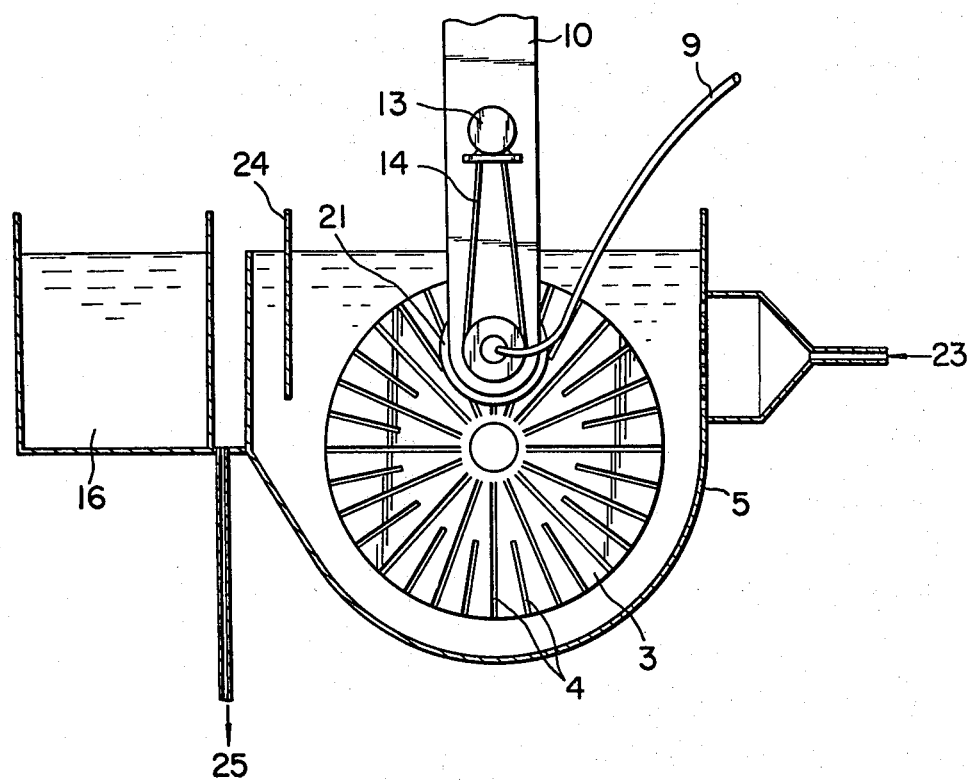
FIG. 5 is another vertical cross sectional view of the apparatus shown in FIG. 4 as cut and viewed along the direction shown by the arrows V—V in FIG. 4.

FIGS. 4 and 5 are each a schematic vertical cross sectional view of a typical example of the inventive apparatus taken as either including the axis of rotation of the rotatable disk 3 (FIG. 4) or perpendicularly to the axis (FIG. 5). As is shown in these figures, a rotatable disk 3 provided with the liquid flow channels 4 on both surfaces is held in a substantially vertical disposition in the etching solution contained in the etching vat 5 by a shaft 6 which in turn is supported by the two opposite side walls of the vat 5 by means of a bearing 7 at each end. The shaft 6 is rotated by the magnetic coupling 8 to ensure uniform rotation of the disk 3.

Closely facing each of the surfaces of the rotatable disk 3 provided with the liquid flow channels 4, wafer materials 11 and 12 are supported each by a sucking unit 21 or 22 to form a narrow gap space between the free surface of the wafer materials 11 or 12 and one of the surfaces of the rotatable disk 3. Each of the sucking units 21 and 22 is connected to a vacuum pump (not shown in the figure) by a hose 9 and supported by the holder arm 10. The sucking units 21 and 22 are rotatable by being driven with the motors 13, 13 through the belts 14, 14. It is of course optional that the driving mechanism for the sucking units 21, 22 with the belts 14, 14 and pulleys is replaced with a combination of suitable gears. The holder arms 10, 10 are moved reciprocatively up and down by means of a mechanism with a cylinder and a piston, cums, crankshafts and the like (not shown in the figures) so that the wafer materials 11, 12 held by the sucking units 21, 22 are also moved up and down along a radial direction of the rotatable disk 3. The etching solution in the vat 5 is introduced from the inlet 23 in FIG. 5 into the vat 5 and overflows therefrom through the weir 24 to be discharged from the exit 25.

As is described above, the wafer material is subjected to the chemical etching in the inventive apparatus as being held vertically by a sucking unit in the vat containing the etching solution closely facing the rotating disk with relative movement of the wafer and the disk by the simultaneous rotation of each of them around its own axis and the reciprocative linear movement of the wafer in a radial direction of the disk. After completion of the chemical etching in the etching vat 5, the wafer is transferred into the rinse vat 16 as it is held by the sucking unit to be rinsed there and freed of the etching solution.

In this case, a wafer material is etched on both surfaces conveniently in the following manner. Thus, the wafer 11 after completion of etching on one surface is transferred from the etching vat 5 into the rinse vat 16 as being held by the sucking unit 21 and thoroughly rinsed there. Then, the other sucking unit 22 is moved on to the free surface of the wafer 11 to receive and hold it by sucking and brings the wafer (which is now wafer 12) to the other side of the rotatable disk 3 so that the second surface not etched in the first step faces the rotatable disk 3 closely side-by-side and is etched similarly to the other surface already etched in the first step. After completion of this second etching, the wafer 12 (previously 11) held by the sucking unit 22 is transferred as held into the rinse vat 16 and thoroughly rinsed there again. In this manner, both surfaces of a wafer material are etched successively by the sequential use of the sucking units 21 and 22, each of which serves for the etching treatment of one of the wafer surfaces.

The first sucking unit 21, from which the wafer 11 after completion of etching on one surface has been transferred to the second sucking unit 22, is then used for holding another wafer and transfers it into the etching vat 5 in which one of the surfaces of this new wafer is etched and again the wafer is delivered to the second sucking unit 22 after rinse in the rinse vat 16. Thus, the linkage motion of the two sucking units 21,22 and a rotatable disk 3 serves to repeat the above described cycle for the etching treatment of a wafer so that a number of wafer materials are subjected one by one in a continuous operation to the treatment of etching means on both surfaces to be imparted with very high flatness and parallelism of the surfaces.

It should be noted that, although the wafer materials subjected to the etching treatment are held substantially vertically in the above description and in FIGS. 4 and 5, it is sometimes advantageous to hold the wafer materials in a horizontal disposition so that the wafer material is freed from the danger of sliding on the sucking unit to fall down into the etching vat, especially, when the sucking power of the sucking unit is not strong enough. It is of course optional that the wafer materials are held in an inclined disposition according to need.

As is readily understood, the inventive apparatus is useful not only for the chemical etching treatment of semiconductor wafers but also for any liquid treatment including chemical etching of the surfaces of any plate-like materials in general. In particular, the versatility of the inventive apparatus gives a way for the etching treatment of semiconductor wafers of any large diameters capable of being compatible with the recent requirements for the high-quality finishing of the wafer surfaces with markedly improved productivity.

What is claimed is:

1. An apparatus for chemically etching a wafer material in an etching solution contained in an etching vat which comprises
   (a) a disk rotatable in the etching solution around an axis, said disk being provided with at least one liquid flow channel on at least one of the surfaces,
   (b) a means for rotating the rotatable disk around the axis thereof,
   (c) a means for holding the wafer material to face the surface of the rotatable disk provided with the liquid flow channel side-by-side in such a manner that the surface of the wafer material facing the rotatable disk is substantially in parallel with the surface of the rotatable disk and exposed free to the etching solution keeping a narrow gap space formed between the free surface of the wafer material and the surface of the rotatable disk,
   (d) a means for rotating the wafer material around the axis thereof, and
   (e) a means for reciprocatively moving the wafer material held by the holding means within a plane parallel with the surface of the rotatable disk in a radial direction of the rotatable disk while the rotatable disk and the wafer material are in rotation.

2. The apparatus as claimed in claim 1 wherein the liquid flow channel is a groove engraved in the rotatable disk in a radial direction thereof.

3. The apparatus as claimed in claim 1 wherein the liquid flow channel is a spiral groove engraved in the rotatable disk around the center thereof.

4. The apparatus as claimed in claim 1 wherein the rotatable disk is provided on both of the surfaces each with at least one liquid flow channel and the means for holding the wafer material is provided at each side of the rotatable disk.

5. The apparatus as claimed in claim 1 wherein the means for holding the wafer material is a sucking unit operated with vacuum.

6. The apparatus as claimed in claim 1 wherein the disk is rotatable around a vertical axis.

7. A method for chemically etching the surface of a wafer material in an etching solution contained in an etching vat which comprises the steps of
   (a) holding the wafer material with a holding means in the etching solution in such a manner that one of the surfaces of the wafer material is exposed free to the etching solution and the wafer material is held closely side-by-side to face a disk rotatable in the etching solution around an axis to make a narrow gap space between the free surface of the wafer material and the disk, said disk being provided on the surface facing the wafer material with at least one liquid flow channel,
   (b) rotating the disk around the axis thereof,
   (c) rotating the wafer material around the axis thereof, and
   (d) moving the wafer material reciprocative-ly in parallel with the rotating disk along a radial direction thereof.

8. The method as claimed in claim 7 wherein the rotatable disk is provided on each of the surfaces with at least one liquid flow channel and a pair of the holding means for wafer materials are provided each at one side of the rotatable disk, the wafer material held by a first holding means and having been etched on one surface being received by a second holding means to be held thereby and to expose the other surface to the etching solution to effect etching thereof.

* * * * *